Figure 1:
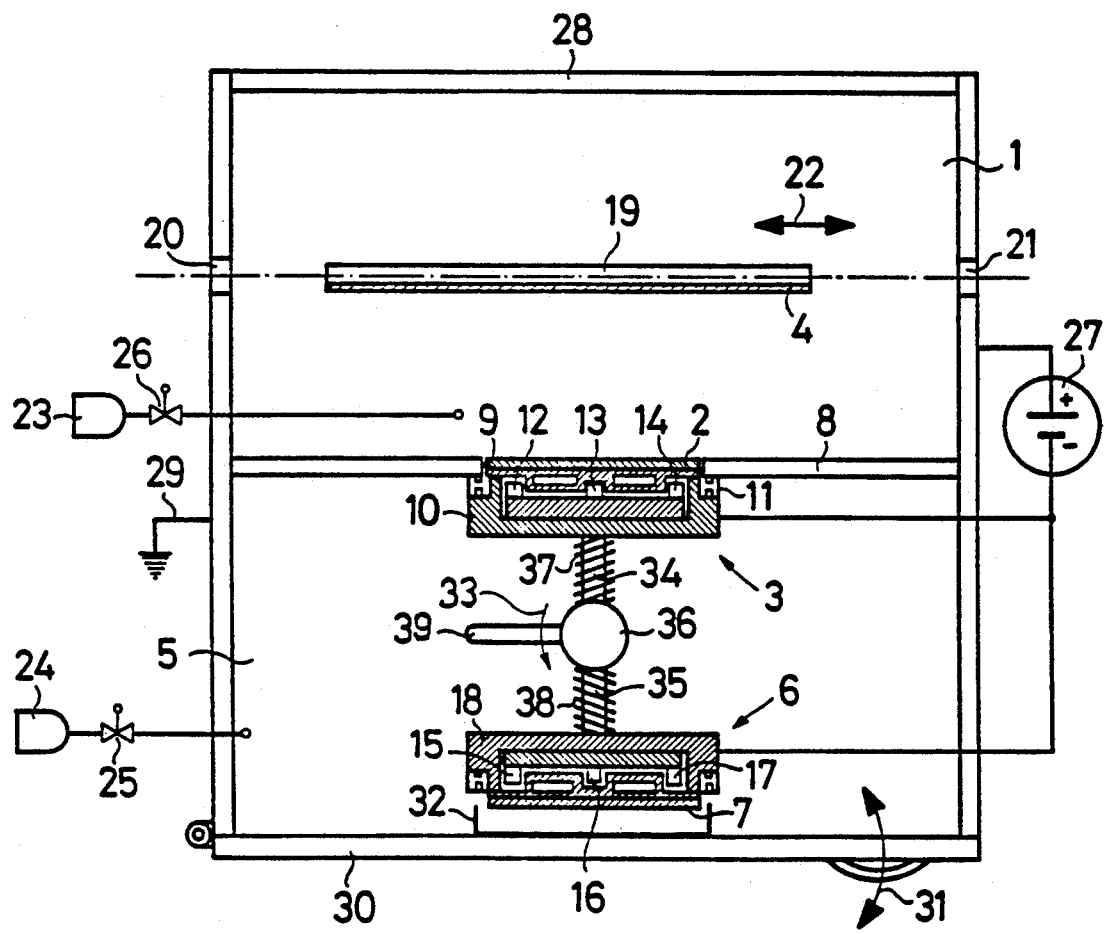

United States Patent [19]

Moses et al.

[11] Patent Number: 5,292,419
[45] Date of Patent: Mar. 8, 1994

[54] SPUTTERING UNIT

[75] Inventors: Gerhard Moses, Hanau; Klaus Michael, Gelnhausen; Ulrich Patz, Linsengericht; Michael Scherer, Rodenbach, all of Fed. Rep. of Germany

[73] Assignee: Leybold Aktiengesellschaft, Hanau, Fed. Rep. of Germany

[21] Appl. No.: 856,880

[22] Filed: Mar. 24, 1992

Related U.S. Application Data

[63] Continuation of Ser. No. 684,666, Apr. 12, 1991, abandoned.

[30] Foreign Application Priority Data

Dec. 20, 1990 [DE] Fed. Rep. of Germany ....... 4040856

[51] Int. Cl.$^5$ .............................................. C23C 14/34
[52] U.S. Cl. ........................ 204/298.28; 204/298.06; 204/298.07; 204/298.23; 204/298.26
[58] Field of Search ............ 204/298.12, 298.16, 204/298.19, 298.18, 298.2, 298.21, 298.22, 298.23, 298.26, 298.27, 298.28, 298.07, 298.06

[56] References Cited

U.S. PATENT DOCUMENTS 3,616,451 10/1971 Gallez ..................... 204/298.28 X
3,756,939 9/1973 Hurwitt ................... 204/298.12 X

FOREIGN PATENT DOCUMENTS 42368 2/1988 Japan ........................... 204/298.28

OTHER PUBLICATIONS

Solid State Technology, vol. 16, No. 12, Dec. 1, 1973, U.S., pp. 100–103, E. D. Segal: "New geometry in sputtering technology".
Patent Abstracts of Japan, vol. 10, No. 139 (C-348) (2196) May 22, 1986 and JP-A-60 262 969 (T.D.K. KK) Dec. 26, 1985 *Abstract*.
Vossen et al., "Thin Film Processes", Academic Press New York, 1978, pp. 41–42.

Primary Examiner—Nam X. Nguyen
Attorney, Agent, or Firm—Felfe & Lynch

[57] ABSTRACT

The invention relates to a sputtering unit with an electrode (3) and a target (2) connected with this electrode (3) wherein this target (2) is interchangeable. Herein a consumed target (2) is replaced by a fresh and pre-sputtered target (7) thereby that the complete electrode (3) is replaced by a new electrode (6).

12 Claims, 4 Drawing Sheets

SPUTTERING UNIT

This application is a continuation of application Ser. No. 684,666, filed Apr. 12, 1991, now abandoned.

The invention describes a sputtering unit according to the preamble of Patent Claim 1.

In vacuum coating technique, as a rule, thin layers of a first material are deposited on a second material. Examples are application in electronics, where resistance layers, conductor layers or insulator layers etc. are applied, or in optics where antireflection coatings, dark coatings, cut-off filters or line filters are produced by means of thin coatings. Sputtering or vaporization has been found to be a method which particularly in the production of these coatings has been found to be especially advantageous. Herein charged particles of a gas or gas mixture are accelerated through an electrical field onto a so-called target comprising the coating material or a component of the coating material. These charged particles knock material out of the target which is deposited on the substrate. In order to avoid reactions with the target material noble gases of high purity are customarily used for sputtering. But the target material through appropriate selection of the sputtering gas and the remaining sputtering conditions can combine on the target surface on the way to the substrate or on the substrate itself with a reactive gas, for example when using $O_2$ or $N_2$ to produce oxides or nitrides. Especially disturbing for a reliable coating are impurities on the target surface which can originate in particular with reactive materials, for example when venting the material or with superficial "poisoning" of the material through reactive components in the sputter gas. Such impurities lead to unstable process conditions. Known examples are the product of In-Sn oxide or Si nitride. These material are therefore as a rule "conditioned" before the production of the coating or also after given times during the production of the coating i.e. they are pre-sputtered with a noble gas, possibly also intermixed with reducing gas components, until the process parameters become stabilized. This pretreatment is time-consuming so that the production process must be interrupted for greater lengths of time.

The invention is therefore based on the task of creating a sputtering unit with which the production process needs to be interrupted only briefly or not at all for target change or generally for target conditioning. This task is solved according to the features of Patent Claim 1.

The advantage achieved with the invention comprises in particular the increase of the availability of a sputtering unit. The target change arrangement is moreover suitable for all types of installations for example for batch type or load-lock units.

Figure 2:
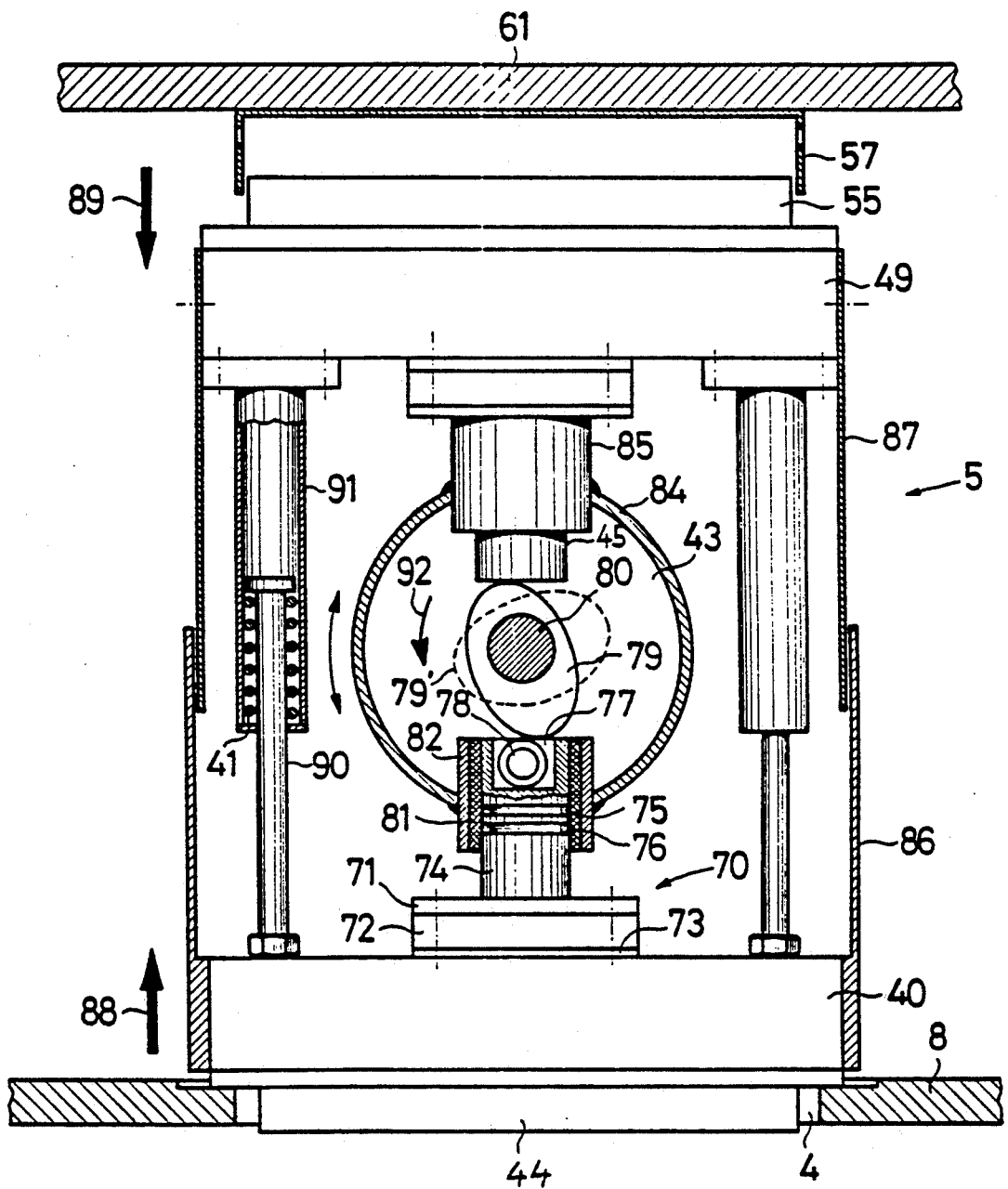
Figure 3:
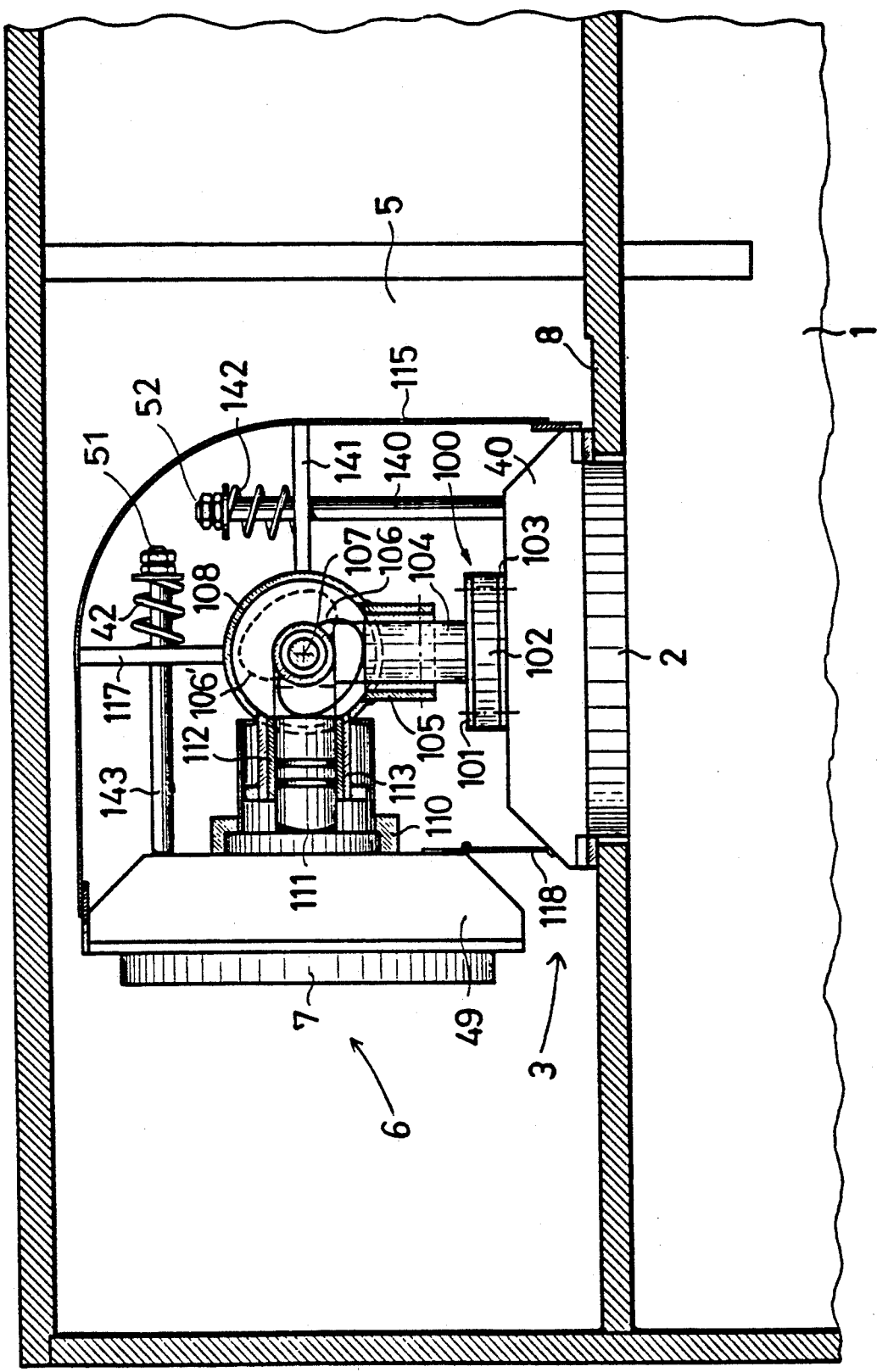
Figure 4:
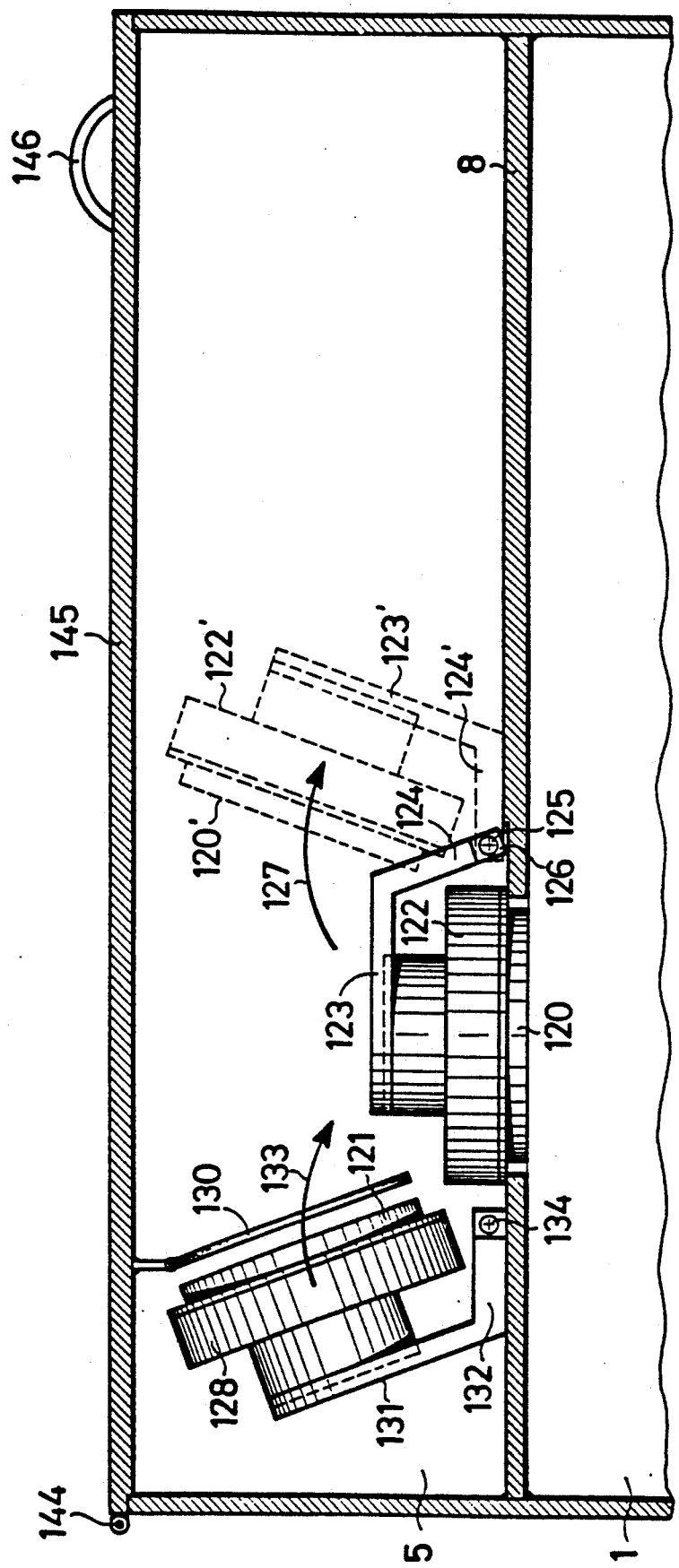

Embodiment examples of the invention are represented in the drawing and will be described in detail in the following. Therein show:

FIG. 1 a schematic representation of a sputtering unit according to the invention with a working chamber, an antechamber, and a first variant of a double electrode;

FIG. 2 an antechamber with a second variant of a double electrode;

FIG. 3 an antechamber with a third variant of a double electrode;

FIG. 4 an antechamber with two electrodes interchangeable by folding.

In FIG. 1 is represented a working chamber 1 in which a coating process takes place wherein particles are knocked out of a target 2 which is a part of a so-called sputtering or vaporization cathode 3. The knocked-out particles arrive on a substrate 4 located in the working chamber and coat or etch it, respectively. Adjoining this working chamber 1 is an antechamber 5 in which is disposed an exchange cathode 6 with an exchange target 7. The working chamber 1 as well as also the antechamber 5 are chambers in which essentially identical conditions obtain.

The working chamber 1 is separated from the antechamber 5 by a wall 8 with an opening 9. Through this opening 9 the target 2 fastened on the cathode 3 reaches from the antechamber 5 into the working chamber. The cathode 3 has a basic body 10 which via an insulating ring 11 rests on the intermediate wall 8. In the cathode 3 are disposed for example permanent magnets 12, 13, 14 for the generation of a magnetic field required for an electron-cyclotron resonance. The cathode 6 is structured correspondingly and has the permanent magnets 15, 16, 17 as well as a basic body 18.

The substrate 4 is disposed on a carrier 19 which can be moved horizontally or vertically through openings 20, 21. This motion is indicated by a double arrow 22. In the openings 20, 21 can be disposed special locks not shown in FIG. 1.

The working chamber 1 as well as also the antechamber 5 is supplied with gas from tanks 23, 24 via valves 25, 26. Both cathodes 3, 6 are also connected to the negative terminal of a dc voltage source 27.

Working chamber 1 and antechamber 5 are enclosed by the same housing 28 which is at ground potential 29 with the antechamber 5 having a door 30 which can be opened and closed in the direction of the arrow 31. On the inside of door 30 is disposed an anode 32. Since it is connected to ground 29 via the electrically conducting interior side of the door and the housing 28 it is positively biased relative to the cathode 6.

The two cathodes 3 and 6 are connected with each other via an arrangement which permits a relative approachment or distancing of the two cathodes 3, 6. If, for example, a lever 39 is moved in the direction of an arrow 33, the electrodes 3, 6 approach each other through guidance of bolts 34, 35 toward a center 36. Through this approachment it is possible to rotate the entire arrangement with the electrodes 3, 6, the bolts 34, 35, and the center 36 and to move the electrode 6 to the site previously occupied by electrode 3.

The interchange of the two cathodes 3, 6 takes place specifically in the following manner:

If the target 2 is consumed due to the sputtering process and must be replaced by a new target 7 the cathodes 3, 6, are pressed together by the activation of lever 39 and against the force of springs 37, 38. Now the entire arrangement is rotated by 180 degrees so that the cathode 6 which previously had been pre-sputtered by means of anode 32 arrives at the site of cathode 3. Cathode 3, in contrast, arrives at that site at which previously cathode 6 had been disposed. Consequently, the sputtering operation can be continued with the fresh target 7 without great time delays.

The old target 2 is remobed thereby that the door 30 is opened and the target 2 is detached from electrode 3. Subsequently the consumed target 2 is replaced by a new target or one which has been intermediately cleaned. The door 30 is closed again and the new target is prepared for use in the working chamber 1. Through the immediate availability of the new target after consumption of the old target any putting-out of operation of the sputtering installation can be dispensed with.

In FIG. 2 is represented a further embodiment of the invention wherein the details of the working chamber 1 have been omitted. The dividing wall 8 between working chamber 1 and antechamber 5 is represented only schematically. On an electrode basic body 40 is flanged a part 70 with three disk elements 71, 72, 73 and a tappet 74. This tappet 74 has in its upper region two grooves 75, 76 for one O-ring each and one recess 77 which is U-form in cross section in which is disposed a cylindrical ball or needle bearing 78. On this roller bearing 78 rests an eccentric cam 79 having a rotary shaft 80. The upper region of tappet 74 is surrounded by a bearing and insulating bushing 81 enclosed by a guidance bearing or a bearing bushing 82 respectively. By 84 is denoted a pipe which projects into the plane of drawing and, sealed at the top and the bottom, is carried out of the presputter-chamber. This pipe 84 has in its internal space 43 atmospheric pressure. It functions furthermore as holder for the two cathode basic bodies 40, 49. For this reason the cooling water supply and current supply to the cathode can take place in pipe 84 and consequently under atmospheric pressure.

Positions 86 and 87 are shielding sheets which are intended to prevent sputtering of the axial guidance of the cathode i.e. of the bearing bolt 74. These shielding sheets 86, 87 are as a function of the shape of the particular cathode disposed about the cathode in box or cylinder form.

If the consumed target 44 is to be replaced by the unconsumed and prepared target 55 the guidances 74, 45 are displaced relative to each other in the direction of arrows 88, 89. The force is applied through a telescoping connection 90, 91 between the two electrodes 40, 49. To this end, first the eccentric cam shaft 80 is rotated in the direction of arrow 92 for example by means of a lever not shown. The eccentric cam 79 which previously had held the distance between the cylinders 82, 85 against the force applied from the telescoping connection 90, 91 it assumes for example the position denoted with 79' and now decreases this distance and permits hereby a further penetration of the guidance bearing 74 in the vertical direction into the bearing bush 81. If the distance between the electrodes 40, 40 is sufficiently decreased the entire arrangement is swiveled by means of the pipe 84, at which is disposed for example a handle not shown, by 180° about the eccentric cam shaft 80 so that the target 55 assumes the site of the consumed target 44. The consumed target 44 can now be exchanged against a new target.

Consequently two processes take place successively. In the first process the eccentric cam shaft 79 rolls off the roller bearing 78 and assumes the position 79' drawn in in dashed lines. When it has assumed this position the entire installation with the electrodes 40, 49 is displaced by 180 degrees by rotation of pipe 84. After the 180° rotation the shaft 80 is rotated against the direction of arrow 92 so that the old distance between the two electrodes 40, 49 is again restored.

In FIG. 3 is represented a further variant of the arrangement according to the invention which differs from the previously described variant thereby that the exchange target 7 is swivelled not by 180 degrees but rather only by 90 degrees. The work target 2 which projects into the working chamber 1 is coupled with the basic body 40 of the electrode 3 which, in turn, is connected with a cathode terminal 100 having three parts 101, 102, 103, and a tappet 104 surrounded by a bearing bush 105. This tappet 104 abuts an eccentric cam 106 having an eccentric cam shaft 107 while the bearing bushing 105 is connected with a cylinder pipe 108 surrounding the eccentric cam 106. The replacement target 7 is connected with an electrode basic body 49 having a bushing 110 and a tappet 111. This tappet 111 is surrounded by a bearing bushing and insulation 112 which is adjoined by a cylinder 113 surrounded by a spiral spring 114. The end of the tappet 111 abuts on the eccentric cam 106. A shielding 115 encompasses both electrodes 3, 6. The stay 117 can be fastened on pipe 108. The same applies for a stay 141. Both stay 117, 141 carry in each instance a bolt 140, 143 having in its upper region a head 51, 52 against which a spring 42 or 142 respectively is braced with its one end. The other end of spring 42, 142 is braced against the stays 17, 141.

The process which takes place during the exchange of a consumed target 2 for a new target 7 is the following. With the aid of a not shown arrangement the eccentric cam shaft 107 is rotated whereupon the eccentric cam 106 leaves its place in which it abuts on the tappet 104, 111. If the eccentric cam 106 has assumed its position 106' shown in dashed lines, then both tappets 104, 111 have approached each other, i.e. the targets 2, 7 are now located closer to the eccentric cam shaft than they had been previously. With the aid of a not-shown arrangement the cylinder 108 is now rotated by 90 degrees so that the target 7 assumes that place which previously had been assumed by target 2.

In FIG. 4 is represented a further variant of the invention in which only the essential parts are shown.

Into the working chamber 1 projects a target 120 which is connected with an associated electrode 122. The electrode 122 is connected with a pivot bearing 125 via a horizontal arm 123 and an arm 124 fastened thereon and extending obliquely downward, which pivot bearing is disposed in a bearing block 126 disposed on the dividing wall 8 between working chamber 1 and antechamber 5.

If the target 120 is consumed the entire electrode 122 with the target 120 is swivelled in the direction of arrow 127 and brought into the position in which the reference numbers are pvrovided with apostrophies. In this position a reserve electrode 128 whose target 121 is presputtered via an anode 130 can be brought into the previous position of electrode 122 by means of its swivel arms 131, 132. To this end the reserve electrode 128 is moved in the direction of arrow 133 and about the swivelling axis 134 after the anode 130 has been folded away. It now assumes the position the electrode 122 had previously assumed.

We claim:

1. Sputtering unit comprising:
   a) a working chamber (1) of a first predetermined volume including a substrate (4) to be treated by sputtered material;
   b) a first target (2) to be sputtered and being arranged opposite to said substrate (4), said target being connected to a first electrode (3);
   c) an antechamber (5) of a second predetermined volume including at least a second target (7), said second target being connected to a second electrode (6) and further including a door (30) for opening said antechamber (5), said door (30) being arranged opposite said second target (7) and away from said first target (2);

d) means (8) for separating said working chamber (1) from said antechamber (5) and said substrate (4), said separating means (8) having an opening therein and said first target (2) immerging into said opening, a distance between said separating means (8) and said door (30) being constant when said door is closed;

e) a third electrode (32) in said antechamber (5), said third electrode being arranged opposite said second target (7) and being electrically connected to said door (30); and f) means (34-39) for removing said first target (2) from said working chamber (1) and bringing said second target (7) to the place of said first target (2), said removing means comprising means for varying the distance between said first and second targets during their exchange.

2. Sputtering unit as stated in claim 1 in which said first target (2, 44, 120) to be sputtered is disposed in the working chamber (1) while said second target (7, 55, 121) which is to replace a consumed target in the working chamber is disposed in the antechamber (5).

3. Sputtering unit as stated in claim 2, in which said antechamber (5) has at least one gas feed (24, 25) and said third electrode (32) which opposes said second electrode (6) with said target (7) to be pre-sputtered.

4. Sputtering unit as stated in claim 3 in which in batch operation of a vacuum installation the electrodes (3, 6) before venting of the process chamber (1) swivel or rotate into the antechamber (5) in which a vacuum obtains.

5. Sputtering unit as stated in claim 1 which includes means for coupling said first and second electrodes (3, 6; 40, 49) with each other so that they can be moved toward each other and be rotated by 180° about an axis (36, 80, 107).

6. Sputtering unit as stated in claim 5, in which said axis is a swivelling axis (36) and which includes rods (34, 35) which carry one electrode (3, 6) each.

7. Sputtering unit as stated in claim 5, which includes an eccentric cam system and in which the distance between said electrodes (40, 49; 3, 6) is variable by means of said eccentric cam system (79, 106).

8. Sputtering unit as stated in claim 1 which includes means for coupling said first and second electrodes (3, 6; 40, 49) with each other so that they can be displaced relative to each other and be rotated by 90° about an axis (36, 80, 107).

9. Sputtering unit as stated in claim 1, in which said means for bringing said second target to the place of said first target brings said second target thereto when the first target is consumed and after said second target is pre-sputtered.

10. Sputtering unit as stated in claim 9 in which said first electrode (122) is rotatable about a first pivot (125) so that it can be moved out of its working position and in which said second electrode (128) is rotatable about a second pivot (134) so that it can be brought from a preparatory position into the working position and which includes swivel arms (123, 124) for rotating said first electrode and swivel arms (131, 132) for rotating said second electrode.

11. Sputtering unit as stated in claim 1 in which at least one of said first electrode (3) and said second electrode (6) respectively serves as a flange for closing an electrode opening (9) in the working chamber (1).

12. Sputtering unit as stated in claim 1 which includes
a) first electrode (3) with a first target (2);
b) a second electrode (6) with a second target (7);
c) an arrangement (34 to 39) for approaching and distancing said first and said second electrode (3, 6);
d) a device for rotating the arrangement (34 to 39) with the electrode (3, 6) about a given angle;
e) a first chamber (1) with a substrate (4) to be worked into which projects the first target (2);
f) a second chamber (5) in which is disposed the second electrode (6);
g) and in which said third electrode comprises an anode in the second chamber (5) opposing said second target (7).

* * * * *